US005156732A

United States Patent [19]

Ogasawara et al.

[11] Patent Number: 5,156,732

[45] Date of Patent: Oct. 20, 1992

[54] POLYIMIDE SUBSTRATE AND METHOD OF MANUFACTURING A PRINTED WIRING BOARD USING THE SUBSTRATE

[75] Inventors: Shuichi Ogasawara; Hideki Kato; Daizo Tomioka, all of Ichikawa, Japan

[73] Assignee: Sumitomo Metal Mining Co. Ltd., Tokyo, Japan

[21] Appl. No.: 863,512

[22] Filed: Mar. 31, 1992

Related U.S. Application Data

[63] Continuation of Ser. No. 573,724, Aug. 28, 1990, abandoned.

[30] Foreign Application Priority Data

Jul. 11, 1990 [JP] Japan ............ 2-182999

[51] Int. Cl.[5] ............ C25D 5/54

[52] U.S. Cl. ............ 205/126; 205/224

[58] Field of Search ............ 205/126, 224; 427/306

[56] References Cited

U.S. PATENT DOCUMENTS 4,517,254 5/1985 Grapentin ............ 204/30
4,775,449 10/1988 Dumas ............ 204/30
4,842,946 6/1989 Foust ............ 204/20

*Primary Examiner*—T. M. Tufariello
*Attorney, Agent, or Firm*—Watson, Cole, Grindle & Watson

[57] ABSTRACT

Disclosed is a method of preparing a copper-polyimide substrate comprising applying an electroless copper plating to the surface of a polyimide resin, wherein the surface of a polyimide resin is first etched so as to form a hydrophilic denatured layer on the surface of the said polyimide resin and, after a catalyst is imparted to the substrate, the substrate is copper-plated and thereafter heat-treated at a temperature of 120° C. or higher thereby to modify the hydrophilic denatured layer to a heat-resistant copper-diffusion preventing layer. Also disclosed is a method of preparing a printed wiring board having the copper-polyimide substrate, comprising a first step of etching the surface of a polyimide resin substrate, a second step of applying a catalyst to the substrate followed by electroless plating thereof to give a copper-polyimide substrate, and a third step of forming a circuit on the thus prepared copper-polyimide substrate; which is characterized in that a hydrophilic denatured layer is formed on the surface of the polyimide resin by the etching of the first-step treatment, and the substrate is heat-treated at a temperature of 120° C. or higher after the copper-plating treatment of the second step or before the circuit-forming treatment of the third step to be effected by plating a conductive metal on the surface of the substrate by the use of a free cyan or cyan compound, whereby the hydrophilic denatured layer is modified into a heat-resistant copper-diffusion preventing layer. The metal plating layer has an excellent adhesion strength capable of withstanding thermal shocks. The substrate can be used for producing electronic parts having high reliability with stable operationability.

20 Claims, No Drawings

POLYIMIDE SUBSTRATE AND METHOD OF MANUFACTURING A PRINTED WIRING BOARD USING THE SUBSTRATE

CROSS-REFERENCE TO RELATED APPLICATION

This application is a continuation of application Ser. No. 573,724, filed Aug. 28, 1990, now abandoned.

FIELD OF THE INVENTION

The present invention concerns a copper-polyimide substrate, in which a copper plating layer capable of withstanding long-time high-temperature treatment at 150° C. or higher and sufficiently resistant to thermal shocks caused by soldering, etc., is formed partially or entirely on the surface of a polyimide resin, as well as a method of manufacturing a printed wiring board using the substrate.

BACKGROUND OF THE INVENTION

Since polyimide resins have excellent heat resistance and are comparable to other plastic materials in view of mechanical, electrical and chemical properties, they are often used as insulating materials such as electric appliances. Printed wiring boards (PWB), flexible printed circuits (FPC), tape automated bonding (TAB), etc. are manufactured by applying photoetching to a copper layer formed on the polyimide resin.

Copper-polyimide substrates as the material used for such PWB, FPC and TAB have generally been prepared by a lamination method of appending a polyimide resin and a copper foil by means of adhesives . However, in a substrate prepared by the lamination method, impurities such as chloride ions or sulfate ions are adsorbed to an adhesive layer present at the boundary between the copper layer and the polyimide resin of the substrate upon etching treatment for the copper layer or peeling treatment for the photoresist, which may lead to a trouble such as insulation failure in a case where distance between circuits formed on the substrate is particularly narrow. In order to overcome such a drawback, there has been studied a method of forming a metal layer directly to the surface of the polyimide resin not by way of the adhesive, etc.

As the method described above there has been known a method of depositing a metal layer directly to the surface of the polyimide resin by means of sputtering, ion plating, vapour deposition, etc., a method of coating a solution of a polyamic acid as a precursor for a polyimide on the metal layer and, thereafter imidizing the polyamide to obtain a substrate or a method of forming a metal plating layer on the surface of a polyimide resin by means of electroless , plating.

Among the methods described above, in the method of depositing the metal layer directly to the surface of the polyimide resin, for example, by means of sputtering, ion plating and vapour deposition, since residual stresses are formed in the copper layer deposited on the surface of the polyimide resin, stresses are concentrated to the boundary between the polyimide resin and the copper film layer when a heat treatment is further applied to the substrate to remarkably reduce the adhesion of the copper film, which may be some time lead to the peeling of the film.

Further, a polyimide resin deposited with a copper film by means of sputtering, ion plating or vapour deposition has often been heated for improving the adhesion of the metal film layer, but a problem is also brought about that copper diffuses into the polyimide resin and deposited as copper oxide particles, thereby remarkably deteriorating the electric property and mechanical property of the substrate.

In order to overcome these problems, it has also been proposed a method of forming an intermediate chromium or nickel layer between a polyimide resin and a copper film to obtain a three-layered structure, applying heat treatment to the stricture, thereby absorbing the stresses concentrated to the boundary in this intermediate layer to prevent reduction of adhesion and peeling of the copper film, as well as to prevent the deposition of copper oxide caused by the diffusion of copper in the polyimide resin. However, in a case of forming circuits by using the substrate obtained by the method and applying patterning, for example, by means of subtracting method, since the metal layer formed on the polyimide resin contains metals such as chromium or nickel in addition to copper, other metals such as chromium or nickel cannot be removed completely but remain as they are when treated with a standard etching solution prepared for the removal of copper, failing to obtain satisfactory circuit formation.

In addition, if chromium or nickel is contained in the metal layer, electrical conductivity is poor as compared with the case that the layer is formed out of pure copper and, if such a substrate is used as electronic material part, reliability is remarkably reduced. Further, even with such a method, when TAB is manufactured based on the resultant substrate, the adhesion strength of the metal layer is utmost 4 lb/in, which is less than 6 lb/in required so far for TAB or printed wiring board.

Further, among the substrate forming methods described above, a method of coating a polyamic acid solution as a precursor of the polyimide on a metal film, and then polyidizing imidizing the same thereby obtaining a copper-polyimide substrate without using the intermediate adhesive layer has been disclosed in U.S. Pat. Nos. 3682960, 4148969 and 4496794, etc. However, in the copper-polyimide substrate obtained by the method, the resin portion of the substrate shrinks remarkably since dehydrating condensation also occurs upon polyimidization of the polyamic acid, which makes it extremely difficult to provide smoothness for the substrate and the substrate lacks in dimensional stability.

Furthermore, the polyimide resin portion in the substrate obtained by the method is remarkably lower in the mechanical strength as compared with the polyimide resin usually supplied in a film-like shape. The reason is because the chemical structure of the polyimide resin obtained by the above-mentioned method is different from that of the polyimide resin supplied in the film-like shape and, although the bondability with the metal layer can be improved, mechanical property such as elongation is poor. Furthermore, in a case where the polyamide acid is coated on the copper film, since a copper portion reacts with amide groups and diffuses into the resin portion, electric property of the substrate is deteriorated and reliability as electronic material is neither sufficient.

Further, the third method for obtaining the copper-polyimide substrate is a method of applying metal coating to the surface of the polyimide resin by means of electroless plating. In this method, etching treatment is usually applied to the surface of the polyimide resin, thereby providing hydrophilic property, adsorbing thereon palladium, etc. as a catalyst and then applying electroless plating.

U.S. Pat. No. 3767538 describes a method of producing a substrate applied with a metal coating by means of electroless plating. The feature of the process resides in applying etching to the surface of the polyimide resin using a solution of sulfuric acid and hydrochloric acid, or mechanically impinging fine particles such as sands to the surface, further, applying etching if required by means of sodium hydroxide, heating the surface to remove water content, and then immersing it into a colloidal palladium bath, thereby effecting a catalyst activation treatment. Subsequently, a silver plating layer having steam permeability is continuously formed on the surface of the polyimide resin by means of electroless plating, heating the substrate to 150° C. for removing water content and, thereafter, applying electrolytic copper plating to the silver film thereby obtaining a copper-polyimide substrate.

However, nothing is reported for the value of the adhesion of the metal layer to the substrate manufactured by the method and, further, since the silver film is directly formed on the surface of the polyimide resin in this method, there is a possibility that insulation failure may be caused between circuits due to silver migration under a high temperature and a high humidity, thus defectively lacking in the reliability in a case of using the TAB tape, etc., manufactured by using the resultant substrate as electronic parts.

U.S. Pat. No. 3573937 suggests another method of forming a metal layer by applying electroless plating to the surface of a polyimide resin. The method resides in applying a catalyst to the surface of a polyimide resin, then forming a plated resist layer, applying nickel-phosphor alloy electroless plating, heating the substrate at a temperature of 190° C. for strengthening the bonding between the plated layer and the polyimide resin and, subsequently, electrolytically plating copper or applying or soldering copper thereon, to obtain a substrate. However, the maximum adhesion of the metal layer is reported to be 5.0 lb/in according to the non-standard test. While the literature suggests nothing about the stability of the adhesion against thermal shocks such as soldering, there is a possibility of causing problems regarding this.

Japanese Patent Laid-Open Sho 63-259083 discloses a method of applying electroless nickel or cobalt plating partially or entirely to the surface of a polyimide resin and applying electrolytic copper plating thereon, thus forming a metal film having a great bondability capable of withstanding thermal shocks such as soldering on a polyimide resin.

The feature of the methods resides in applying etching to the surface of the polyimide resin with an aqueous solution containing an amine of $H_2N(CH_2)_nNH_2$ (n represents an integer between 2 and 6), an alkali metal hydroxide and an alcohol of a structure soluble in water, providing a catalyst, applying electroless nickel and cobalt plating and, finally, applying electrolytic copper plating.

The adhesion of the metal layer in the disclosed example of the substrate obtained by the method is 10.0 lb/in according to IPC-TM-650 Method 2.4.9. As Received Method A and 5.0 lb/in according to IPC-TM-650 Method 2.4.9. After Solder Float Method C, by which the adhesion satisfactory to some extent can be nickel and cobalt in the substrate obtained by the above-mentioned method could be removed finally by means of an iron chloride etching solution, if the substrate is utilized for a TAB tape, with narrow width and interval of lead, the copper lead cannot maintain the shape till the complete removal of the nickel and cobalt layer due to the difference of the solubility of nickel and cobalt relative to iron chloride and, accordingly, reliability is poor when the TAB tape is assembled as an electronic part. Further, in a case of forming a copper layer by electroless copper plating directly to the surface of the polyimide resin by the above-mentioned method, it has been shown that the copper layer is peeled off in IPC-TM-650 Method 2.4.9. After Solder Float Method C. Thus, at present, it has not yet been actually established a technique capable of directly forming a copper layer having adhesion capable of withstanding thermal shock such as soldering partially or entirely on the surface of the polyimide resin substrate.

Further, in a case of using a substrate obtained by applying an electroless plating to the polyimide resin as described above, applying patterning to form a copper layer of a desired width and then applying plating to the copper layer by using a solution containing a free cyan or cyan compound thereby preparing a wiring board, there has also been found a problem that the copper layer is peeled off from the surface of the polyimide resin.

On the other hand, recently with elevation of the integration degree of IC, LSI and the like electronic devices, it has become expected that a high heat energy is to be irradiated from IC, LSI or the like device to a substrate for a long period of time when such a device is fitted to the substrate. Under the situation, the substrate is required to have a heat-stability stability as its characteristic when a high heat is imparted to the substrate for a long period of time.

The reliability of a substrate with respect to the high-temperature resistance characteristic thereof under the condition of a high temperature ambient for a long period of time may often be determined by examining the change, if any, of the characteristic values of the substrate, after the substrate to be examined has been stored in an atmosphere of 150° C. for a period of 1000 hours.

Regarding the adhesion strength of the metal layer after the above-mentioned heat-resistance test, for example, in the case of TAB, a critical value of 1.0 lb/in or more is required. However, it has been found that the adhesion strength of the conventional substrate is lowered to 0.5 lb/in after the heat-resistance resistance test, which means that not only the substrate could not satisfy the above-mentioned indispensable value when it has been exposed to a high temperature ambient for a long period of time but also the metal layer would be peeled off from the substrate because of the lowering of the adhesion strength of the layer to the substrate when IC, LSI or the like device is fitted to the substrate and a high heat energy to be irradiated from such device is imparted to the substrate for a long period of time.

SUMMARY OF THE INVENTION

It is, accordingly, an object of the present invention to provide a method of manufacturing a copper-polyimide substrate prepared by forming partially or entirely on the surface of a resin a copper film having such a high adhesion as sufficiently withstanding thermal shocks such as caused by soldering by means of electroless plating, having sufficient electrical, mechanical and thermal reliability when used in electronic parts such as TAB and being free from extreme lowering of the adhesion strength of the metal layer when exposed to a high heat ambient for a long period of time, as well as a method of manufacturing a printed wiring board using such a substrate.

The present inventors have made various studies for the reason why it is impossible to obtain a copper film having such a high adhesion as capable of withstanding thermal shocks such as caused by soldering in the copper-polyimide substrate obtained by the electroless plating method and, as a result, have found that a denatured layer of poor heat resistance is often formed on the surface of a polyimide resin by applying pre-treatment of electroless plating in the method conducted so far and, upon applying electroless plating and applying thermal shocks such as by soldering to the substrate in this state, the plating layer tends to easily peel off from the interface between the denatured layer portion or the polyimide resin and the denatured layer, further, that since the denatured layer is dissolved by a free cyan or cyan compound used in the case of manufacturing a printed wiring board, etc. by using the substrate, peeling of the metal layerfrom the surface of the substrate is also promoted therewith, as well as that the denatured layer can be converted into thermally resistant structure by applying heat treatment within an appropriate temperature range to the substrate containing the denatured layer.

The present inventors have further found that the substrate thus prepared may sufficiently be used in small-capacity electronic parts as it is, but when it is used in a large-capacity electronic part and is receives a high-temperature heat irradiation for a long period of time, copper would diffuse into the inside of the polyimide resin from the plated interface to often cause peeling from the inside of the resin into which copper has diffused or from the interface between the diffused copper and the resin; that diffusion of copper into the resin is extremely promoted when the substrate is exposed to a high temperature in an oxidizing atmosphere, for example, when it is stored in a high-temperature air for a long period of time; and that diffusion of copper into the inside of a polyimide resin under such a high-temperature oxidizing atmosphere may remarkably be lowered by forming a particular hydrophilic denatured layer on the surface of the polyimide resin by etching-treatment with a particular chemical such as sulfuric acid or the like in the pre-etching followed by conducting heat-treatment of the substrate after electroless plating thereof to thereby modify the structure of the said hydrophilic denatured layer into one which is heat-resistant and which may prevent diffusion of copper into a polyimide resin, and accordingly even though the thus modified substrate is exposed to an oxidizing atmosphere such as air at a high temperature for a long period of time, lowering of the adhesion strength of the metal layer may noticeably be prevented. On the basis of such findings, the present inventors have accomplished the present invention.

Specifically, in order to overcome the foregoing problems, the present invention provides a method of manufacturing a copper-polyimide substrate by applying electroless copper plating to the surface of a polyimide resin optionally followed by applying electrolytic copper-plating thereto, wherein the surface of a polyimide resin is first etched to form a hydrophilic denatured layer thereon, and after a catalyst is imparted thereto, the surface of the substrate is subjected to electroless copper-plating and then optionally to electrolytic copper- lating, and thereafter the substrate is heat-treated at a temperature of 120° C. or higher so as to midify the previously formed hydrophilic denaturated layer to further a heat-resistant copper diffusion-preventing layer; and also provides a method of manufacturing a printed wiring board using such a substrate. As one preferred embodiment, sulfuric acid is used in the etching step. As another preferred embodiment, the etching step is effected by two-stage procedure where a diamine is used in the first stage etching and a quaternary ammonium hydroxide is used in the second stage etching. Accordingly, the hydrophilic denatured layer to be formed on the surface of a polyimide resin by the etching treatment is modified into a layer having an excellent heat-resistance and an excellent copper diffusion-preventing property by the heat-treatment to be effected after the electroless copper-plating, whereby the quality of the copper-polyimide substrate or the printed wiring board having the substrate, when used in a large-capacity electronic part, can remarkably be improved by the present invention.

DETAILED DESCRIPTION OF THE INVENTION

Generally, upon manufacturing a copper-polyimide substrate by electroless plating, it is necessary to render the surface of the resin hydrophilic by applying an etching treatment to the surface of the polyimide resin for providing a catalyst in order to promote the plating prior to applying the plating treatment. An etching solution generally used for providing the hydrophilic property to the polyimide resin, there can be mentioned an alkaline solution such as an aqueous solution of an amine compound, e.g., hydrazine or ethylene diamine, or an aqueous solution of an alkali metal hydroxide, which may contain alcohols such as ethanol .

This is because, although a polyimide is chemically stable, the imide groups of constituting a polyimide can be reduced and cleaved by a strong reducing agent such as hydrazine or the like and the carbonyl groups can be hydrolyzed with an alkali, whereby the thus treated part of the polyimide is decomposed to a polyamic acid containing hydrophilic carboxyl groups and accordingly the surface of the thus treated polyimide may be relatively easily hydrophilicated.

The thus formed hydrophilic denatured layer has a fairly poor heat-resistance as compared with the original polyimide of itself. However, by the studies of the present inventors, it has been found that the denatured layer may be restored again to have a thermally stable structure by heat-treatment of the substrate, after plated, at a temperature ranging from 120° to 420° C. so as to dehydrate and condensate the said denatured layer to again polyimidize the layer.

However, even in the case of the substrate as heat-treated after plated by electroless plating, lowering of the adhesion strength of the metal layer to the substrate has been found inevitable when the substrate has been kept in a high-temperature air atmosphere for a long period of time.

By the present inventors observation, it is noted that the above-mentioned problems occur only in the case when a metal layer is formed on a part or all of one surface of a polyimide resin but they do not in the case when a metal layer is entirely formed on all the surfaces of a polyimide resin.

Additionally, even when a metal layer is formed only on a part or all of one surface of a polyimide resin, lowering of the adhesion strength of the metal layer to the substrate does not occur only if the substrate is heated in an oxygen-free atmosphere, for example at a high temperature of 150° C., for a long period of time.

In order to overcome the problems, the present inventors have observed the distribution of elements in the plated interface of a substrate, which has been kept in an air at 150° C. for 1000 hours, by means of AES, they have admitted that copper and oxygen have diffused into the inside of the resin in the depth of several hundreds Å from the plated interface. After successive peeling test of peeling the metal layer from the substrate, it has also been found that peeling occurs from the inside of the copper-diffused resin or from the interface between the copper-diffused part and the non-diffused part.

From the above-mentioned facts, it may be considered that when a polyimide resin substrate as plated by electroless plating and thereafter heat-treated is kpet in a high-temperature air atmophsere for a long period of time without forming metal layers entirely over the all surfaces of the polyimide resin, oxygen would penetrate into the inside of the substrate resin from the part thereof which has not been coated with a metal layer to reach the plated interface to cause reaction of copper and the polyimide or diffusion of copper into the polyimide, since the polyimide has an easily oxygen-permeable structure, and, as a result, the adhesion strength of the metal layer to the substrate would thereby be lowered.

Under the situation, the present invention has been accomplished on the basis of the finding that the hydrophilic denatured layer as formed by hydrophilicating the surface of a polyimide resin by etching with an etching agent of a certain kind can be modified to have a thermally stable structure by heat-treatment of the denatured layer after electroless plating thereof while the thus modified structure may have a property of hardly causing diffusion of copper into the inside of the polyimide resin even after the substrate is kept in a high-temperature air atmosphere for a long period of time.

In accordance with the method of the present invention, one preferred embodiment of the etching agent to be used for imparting hydrophilicity to the polyimide resin substrate is sulfuric acid.

The present inventors have studied and have found that the denatured layer to be formed by etching of a polyimide reisn with sulfuric acid is naturally different from the denatured layer to be formed by reduction of a hydrazine monohydrate which is generally used in the hydrophilicating treatment of the kind or from the denatured layer to be formed by hydrolysis with an alkali; and that when the substrate having such a denatured layer as formed by etching treatment with sulfuric acid is heat-treated at a temperature of 120° C. or higher, the resulting substrate may have an excellent thermal stability and may also be modified into one having a structure where copper could hardly diffuse into the inside of the polyimide resin even though the substrate is kept in a high-temperature air atmosphere for a long period of time.

Accordingly, the substrate thus hydrophilicated by etching with sulfuric acid and thereafter subjected to electroless plating followed by heat-treatment at a determined temperature is free from peeling of the metal layer even when a thermal shock, for example, by soldering is imparted thereto Regarding the adhesion strength of the metal layer to the substrate, the mean value is 9.5 lb./in. according to IPC-TM-650 Method 2.4.9. As Received Method A; while it is 8.4 lb./in. according to IPC-TM-650 Method 2.4.9. After Solder Float Method C. That is, the adhesion strength is extremely high. After the substrate has been kept in an air of 150° C. for 1000 hours, the adehsion strength of the metal layer still is high to be 3.0 lb./in. or more. Therefore, electronic parts such as TAB as manufactured by using the substrate may sufficiently satisfy the necessary values.

The concentration of sulfuric acid to be used in the above-mentioned sulfuric acid-etching treatment is desirably 30% by weight or more, more preferably 80% by weight or more. If the sulfuric acid concentration is less than 30% by weight, it is difficult to hydrophilicate a polyimide resin even though the resin is heated during the treatment. Where the sulfuric acid concentration is to fall within the range offrom 30 to 80% by weight, hydrophilication of a polyimide resin may well be effected under the condition of an elevated temperature of 50° C. or higher or at room temperature. In the latter case, the treatment is effected for a long period of time. If the sulfuric acid concentration is more than 80% by weight, hydrophilication of the surface of a polyimide resin may well be effected even at room temperature for a short period of time.

In accordance with another preferred embodiment of the method of the present invention of hydrophilicating the polyimide resin substrate, the etching treatment is effected by a two-stage procedure in which etching of the first stage is effected by the use of a diamine of a general formula $H_2N(CH_2)_nNH_2$ (where n represents an integer of from 2 to 6) or a hydrate thereof and etching of the second stage is effected by the use of a solution containing a quaternay ammonium hydroxide of a general formula:

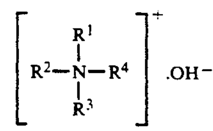

where $R^1$ and $R^2$ independently represent an alkyl group having from 1 to 4 carbon atoms; $R^3$ represents an alkyl group having from 1 to 18 carbon atoms or an alkenyl group having from 1 selected from the group consisting of to 18 carbon atoms; $R^4$ is selected from the group consisting of an alkyl group having from 1 to 18 carbon atoms, an alkenyl group having from 1 to 18 carbon atoms, a benzyl group, and an alkylbenzyl group in which the alkyl moiety has from 1 to 18 carbon atoms.

Needless to say, it is a matter of course that the same excellent heat-resistance and copper diffusion preventing effect can be attained also in the case as that attained in the above-mentioned case where the hydrophilication treatment is effected by the use of sulfuric acid, after electroless plating of the resulting substrate followed by heat-treatment thereof.

The reason why the etching treatment is effected by the above-mentioned two-stage procedure is because the low molecular diamine which has a high chemical affinity to the polyimide resin may penetrate into the inside of the polyimide resin to thereby make the chemical bond of the polyimide as a polymer unstable by the first stage etching treatment and additionally, the thus chemically unstabilized portions of the polymer are hydrolyzed with a weak alkali such as the above-mentioned quaternay ammonium hydroxide by the second stage etching treatment whereby the surface of the polyimide resin may finally be hydrophilicated to be finely rough with ease.

However, if the etching solution to be used in the first stage etching treatment and the etching solution to be used in the second stage etching treatment are blended and the polyimide resin is etched with the resulting blend etching solution, the effect of the present invention cannot be attained since the effects of the both solutions are counter-balanced with each other.

On the other hand, if the etching treatment is effected in the presence of a strong reducing agent such as hydrazine, the adhesion strength of the metal layer to the substrate would extremely lower when the substrate is exposed to a high-temperature oxidizing atmosphere as mentioned above.

The substrate as obtained by plating the substrate as etched by the said two-stage etching treatment by electroless plating followed by heat-treatment of the resulting substrate at a determined temperature in accordance with the method of the present invention does not cause peeling of the metal layer from the substrate even though a thermal shock, for exmaple, by soldering is imparted thereto, like the substrate as etched with sulfuric acid.

Regarding the adhesion strength of the metal layer to the substrate after heat-treatment, the mean value is 8.0 lb/in. according to IPC-TM-650 Method 2.4.9. As Received Method A; while it is 7.4 lb.in. according to IPC-TM-650 Method 2.4.9. After Solder Float Method C. That is, the adhesion strength is extremely high. After the substrate has been kept in an air of 150° C. for 1000 hours, the adhesion strength of the metal layer still is high to be 4.0 lb.in or more. Therefore, electronic parts such as TAB as manufactured by using the substrate may sufficiently satisfy the necessary values, and additionally, the reliability of the substrate in the parts is fully high.

In the diamine of a general formula $H_2N(CH_2)_nNH_2$ to be used in the first stage of the said two-stage etching treatment, the value n represents an integer of from 2 to 6. This is because the diamine having a lower molecular weight is to have a higher affinity to polyimides and therefore etching of polyimides with the diamine having a lower molecular weight is easier. Where n is 7 or more, the diamines would have a poor affinity to polyimides and therefore could not display a sufficient etching effect.

As typical examples of the quaternary ammonium hydroxide of the above-mentioned general formula, which are preferably employed in the second stage etching treatment of the present invention, there are mentioned tetramethylammonium hydroxide, tetraethylammonium hydroxide, tetrapropylammonium hydroxide, tetrabutylammonium hydroxide, benzyltrimethylammonium hydroxide, phenyltrimethylammonium hydroxide, dodecyltrimethylammonium hydroxide, octadecyltrimathylammonium hydroxide, dodecyltriethylammonium hydroxide, octadecyltriethylammonium hydroxide, dodecyltripropylammonium hydroxide, benzyldimethyloctadecylammonium hydroxide, and p-dodecylbenzyltrimethylammonium hydroxide. The etching solution to be employed in the second etching step is preferably in the form of an aqueous solution or alcoholic solution containing the hydroxide.

A catalyst is imparted to the surface of the thus etched polyimide resin for the purpose of promoting the successive plating, and the resin is plated by electroless plating and thereafter heat-treated. The last heat-treatment is effected for the purpose of re-modifying the chemical structure of the hydrophilic denatured layer formed by the previous etching treatment, and it is naturally different from an ordinary heat-treatment which is generally effec'ed in an ordinary electroless plating at a temperature of 70° to 150° C. for the purpose of removal of water.

Specifically, the heat-treatment of the present invention is effected for the purpose of modifying the chemical structure of the hydrophilic denatured layer as formed on the resin substrate to one which is thermal stable and in which copper hardly diffuses even when the substrate is kept in a high-temperature oxidizing atmosphere for a long period of time. Therefore, the proper temperature necessary for the heat-treatment varies in accordance with the means to be employed for effecting the heat-treatment. For instance, where the heat-treatment is effected by the use of a vacuum heating furnace, the temperature is necessarily 120° C. or higher, preferably 150° C. or higher. Where the heat-treatment is effected by the use of an ordinary heating furnace in an inert gas atmosphere in air, the temperature is necessarily 250° C. or higher.

If the temperature for the heat-treatment is lower than the said range, modification of the hydrophilic denatured layer would hardly occur. However, where the heat-treatment is effected at a too high temperature for a too long period of time, the chemical structure of the polyimide resin itself would be decomposed to deteriorate the excellent intrinsic characteristics of the polyimide resin of itself. For instance, where the substrate is heat-treated in a heating furnace having a nitrogen atmosphere kept at 460° C., no chemical change of the polyimide resin occurs within a heat-treatment time of 15 minutes with no change of the characteristics of the resin. However, if the heat-treatment is effected for a period of 15 minutes or more under the same condition, the chemical structure of the polyimide resin would begin to decompose whereby the mechanical and electrical characteristics of the substrate would be deteriorated. If such a deteriorated substrate is used in forming electronic parts, the reliability of the parts would lower.

As mentioned above, the conditions of the heat-treatment in the method of the present invention are in close contact with the kind of the heat-treatment means, the heating temperature and the heating time and therefore could not be defined indiscriminately. Accordingly, it is desired that the conditions of the heat treatment are previously determined on the basis of preliminary experiments or the like, in practically and actually carrying out the method of the present invention.

The polyimide resin to be used in the present invention may be anyone obtainable by imidizing a polyamic acid by thermal or chemical dehydro-condensation of the amide groups and the carboxyl groups of the acid, which includes, for example, Kapton (trade name of product manufactured by Dupont-Toray Co.,Ltd.) having the folloiwng chemical formula:

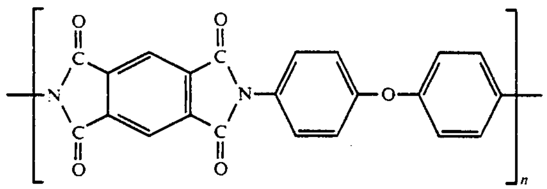

as well as Upilex (trade name of product manufactured by Ube Industries, Ltd.) having the following chemical formula:

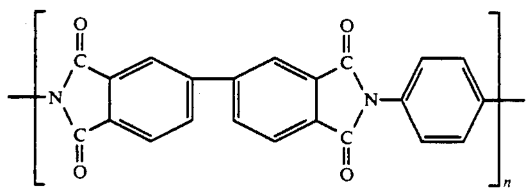

The step of applying the heat-treatment in the present invention is different depending upon the desired plating positions to the polyimide resin. That is, in a case of applying plating partially to the surface of the polyimide resin, the heat-treatment in accordance with the present invention may be applied either after electroless plating or after the electrolytic plating applied subsequently. Since steams generated upon heat-treatment permeate to escape from the surface of the polyimide resin, neither the swelling at the plating interface nor the peeling of the plating layer occurs.

In a case of applying plating to the entire surface of the polyimide resin, it is necessary to apply the heat treatment after the electroless plating or at a stage when an electrolytically plated thin layer of less than 5 microns has been formed. If heat-treatment is applied after the copper plating layer has been formed on the entire surface of the polyimide resin in a thickness of more than 5 microns, since steams evolved upon heat-treatment cannot completely permeate through the copper films, it may cause a worry that swelling may occur along the interface of the plating layer or the plating layer may be peeled off.

Further, the heat-treatment conducted in the present invention can be applied, not in the production step of the electroless-plated substrate, but in the production step for various printed wiring boards, manufactured by utilizing the resulting substrate. That is, such as printed wiring board is usually obtained by patterning a copper-polyimide substrate prepared by electroless plating such that a metal layer of a desired width is formed by the patterning treatment and then applying plating treatment to the metal layer by using a solution containing a free cyan or cyan compound. However, in the thus obtained wiring board, the metal layer often peels off from the surface of the substrate to deteriorate the reliability of the products. The present inventors have studied on this phenomenon and, as a result, confirmed thit is caused by the reason that the denatured layer of the polyimide resin formed by the electroless plating pre-treatment is exposed to the surface of the substrate by the patterning treatment and dissolved by a solution containing a free cyan or cyan compound, which makes the deposition of the metal layer unstable on the surface of the substrate to cause peeling.

Accordingly, when applying a heat-treatment within a temperature range from 120° to 420° C. to a substrate before applying the plating treatment to the substrate by using the cyan solution, thereby imidizing the denatured layer so as to be less soluble to the solution containing the free cyan or cyan compound, it is possible to prevent the peeling of the metal layer of the substrate.

Further, in the present invention, there is no particular restriciton on the atmosphere of the heat-treatment. That is, any of aerial, inert gas or vacuum atmosphere can be employed for the heat-treatment to obtain the same result. However, a long-time heat-treatment in an aerial atmosphere would cause gradual proceeding of diffusion of the copper into the polyimide resin substrate and, as a result, the adhesion the copper layer would become easily oxidized. Because of the reasons, it is most recommended that the heat-treatment in the method of the present invention is effected in an oxygen-free atmosphere.

Next, the present invention will be explained in more detail by way of the following examples, which, however, are not intended to restrict the scope of the present invention.

Briefly, in Examples 1 to 19, sulfuric acid was used in etching the polyimide resin. Characteristics of the substrates prepared are shown therein. Additionally, using the substrates prepared, TAB tapes were prepared, characteristics of which are also shown therein. Comparative Examples 1 to 4 gave comparative samples, which were compared with the samples prepared in Examples 1 to 19.

In Examples 20 to 40, etching of the polyimide resin was effected by two-stage procedure, where the first step etching was effected with a diamine and the second step etching with a quaternary ammonium hydroxide. Characteristics of the substrates prepared are shown therein. Additionally, using the substrates prepared, TAB tapes were prepared, characteristics of which are also shown therein. Comparative Examples 5 to 9 gave comparative samples, which were compared with the sampels prepared in Examples 20 to 40.

A. EXAMPLES AND COMPARATIVE EXAMPLES WHERE ETCHING OF POLYIMIDE RESIN IS EFFECTED WITH SULFURIC ACID

EXAMPLE 1

A polyimide resin film sample (Kapton 200H, manufactured by Dupont-Toray Co.,Ltd.) having a size of 30 cm×30 cm was etched by dipping it in an aqueous solution containing 90% by weight of sulfuric acid and having a temperature of 25° C. for one minute with one surface thereof being shielded. After washed with water, OPC-80 Catalyst M (manufactured by Okuno Chemical Industries, Co., Ltd.) was applied to the sample and treated therewith for 5 minutes at 25° C. Then the sample was again fully washed with water, and OPC-555 Accelerator (manufactured by Okuno Chemical Industries, Co., Ltd.) was applied thereto to effect acceleration treatment of the sample at 25° C. for 7 minutes. After washed with water, the surface of film sample was dried at 20° C. for 2 minutes. After the pre-treatment, the sample was then copper-plated by electroless plating under the conditions mentioned below.

| Bath Compositon |
| --- |

-continued

| | |
|---|---|
| $CuSO_4.5H_2O$ | 10 g/liter |
| EDTA.2Na | 30 g/liter |
| 37% HCHO | 5 ml/liter |
| 2,2'-Bipyridyl | 10 mg/liter |
| PEG #1000 | 0.5 g/liter |
| Plating Condition | |
| Temperature | 65° C. |
| Stirring | Air |
| Time | 5 minutes |

The thickness of the resulting electroless plated copper was 0.2 micron.

Then, the substrate was stood still in a vacuum heating furnace in which the temperature was elevated at a rate of 10° C./min.under degree of $10^{-4}$ Torr, whereupon the substrate was heat-treated therein at 400° C. for one hour and then cooled to room temperature.

Further, the substrate was electrolytically copper-plated under the conditions mentioned below.

| Bath Composition | |
|---|---|
| $CuSO_4.5H_2O$ | 80 g/liter |
| $H_2SO_4$ | 150 g/liter |
| Electrolysis Condition | |
| Temperature | 25° C. |
| Cathode Current Density | 3 A/dm$^2$ |
| Stirring | Air and Cathode Locker |
| Time | one hour |

The thickness of the thus formed copper film on the substrate was 35 microns. The adhesion strength of the film was 9.8 lb/in as a mean value according to IPC-TM-650 Method 2.4.9. As Received Method A and was 8.2 lb/in as a mean value according to IPC-TM-650 Method 2.4.9. After Solder Float Method C.

Next, the substrate was put in air at 150° C. for 1000 hours and the adhesion strength of the copper film was measured to be 3.5 lb/in.

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 2

A copper-polyimide substrate was prepared in the same manner as in Example 1 except that a polyimide reisn film of Kapton 100H (manufactured by Dupont-Toray Co., Ltd.) was used.

The adhesion strength of the copper film to the substrate was 9.0 lb./in. as a mean value according to IPC-TM-650 Method 2.4.9. As Received Method A and was 7.5 lb./in. as a mean value according to IPC-TM-650 Method 2.4.9. After Solder Float Method C.

Next, the substrate was kept in air at 150° C. for 1000 hours and the adhesion strength of the copper film was measured to be 3.2 lb/in.

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 3

A copper-polyimide substrate was prepared in the same manner as in Example 1 except that a polyimide resin film of Kapton 500H (manufactured by Dupont-Toray Co., Ltd.) was used.

The adhesion strength of the copper film to the substrate was 9.9 lb./in. as a mean value according to IPC-TM-650 Method 2.4.9. As Received Method A and was 8.5 lb./in. as a mean value according to IPC-TM-650 Method 2.4.9. After Solder Float Method C.

Next, the substrate was kept in air at 150° C. for 1000 hours and the adhesion strength of the copper film was measured to be 3.6 lb./in.

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 4

A copper-polyimide substrate was prepared in the same manner as in Example 1 except that a polyimide resin film of Kapton 200 V (manufactured by Dupont-Toray Co., Ltd.) was used.

The adhesion strength of the copper film to the substrate was 9.8 lb./in. as a mean value according to IPC-TM-650 Method 2.4.9. As Received Method A and was 8.2 lb./in. as a mean value according to IPC-TM-650 Method 2.4.9. After Solder Float Method C.

Next, the substrate was kept in air at 150° C. for 1000 hours and the adhesion strength of the copper film was measured to be 3.4 lb./in.

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 5

A copper-polyimide substrate was prepared in the same manner as in Example 1 except that a polyimide resin film of Upilex 50ss (manufactured by Ube Industries, Ltd.) was used.

The adhesion strength of the copper film to the substrate was 10.2 lb/in as a mean value according to IPC-TM-650 Method 2.4.9. As Received Method A and was 8.6 lb/in.as a mean value according to IPC-TM-650 Mehtod 2.4.9. After Solder Float Method C.

Next, the substrate was kept in air at 150° C. for 1000 hours and the adhesion strength of the copper film was measured to be 5.6 lb./in..

Additionally, it was confirmed that the difference in the adhesion strength depending on different portions of the substrate was slight and therefore a substantially uniform plated film was formed on the substrate.

These facts demonstrate that the substrate fromed has a sufficient reliability in a case of using it in electronic parts such as TAB.

EXAMPLE 6

A copper-polyimide substrate was prepared in the same manner as in Example 1 except that a polyimide resin film of NPI 50 (manufactured by Kanegafuchi Chemical Industry Co., Ltd.) was used.

The adhesion strength of the copper film to the substrate was 9.8 lb./in. as a mean value according to IPC-TM-650 Method 2.4.9. As Received Method A and was 7.9 lb./in. as a mean value according to IPC-TM-650 Method 2.4.9. After Solder Float Method C.

Next, the substrate was kept in air at 150° C. for 1000 hours and the adhesion strength of the copper film was measured to be 3.6 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 7

A copper-polyimide substrate was prepared in the same manner as in Example 1, except that the both surfaces of the polyimide resin film were entirely copper-plated without shielding one surface thereof and thereafter heat-treated in the same manner.

The adhesion strength of the copper film to the substrate was 7.8 lb/in.as a mean value according to IPC-TM-650 Method 2.4.9. As Received Method A and was 6.7 lb./in. as a mean value according to IPC-TM-650 Method 2.4.9. After Solder Float Method C.

Next, the substrate was kept in air at 150° C. for 1000 hours and the adhesion strength of the copper film was measured to be 5.9 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 8

A copper polyimide substrate was prepared in the same manner as in Example 1, except that etching of the surface of the polyimide resin film was effected with an aqueous solution containing 30% by weight of sulfuric acid at 50° C. for 5 minutes.

The adhesion strength of the copper film to the substrate was 8.6 lb./in. as a mean value according to IPC-TM-650 Method 2.4.9. As Received Method A and was 6.8 lb./in. as a mean value according to IPC-TM-650 Method 2.4.9. After Solder Float Method C.

Next, the substrate was kept in air at 150° C. for 1000 hours and the adhesion strength of the copper film was measured to be 3.0 lb/in.

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 9

A copper-polyimide substrate was prepared in the same manner as in Example 1, except that etching of the surface of the polyimide resin film was effected with an aqueous solution containing 98% by weight of sulfuric acid (concentrated sulfuric acid solution) at room temperature for 10 seconds.

The adhesion strength of the copper film to the substrate was 11.2 lb./in. as a mean value according to IPC-TM-650 Method 2.4.9. As Received Method A and was 9.7 lb./in. as a mean value according to IPC-TM-650 Method 2.4.9. After Solder Flaot Method C.

Next, the substrate was kept in air at 150° C. for 1000 hours and the adhesion strength of the copper film was measured to be 4.0 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 10

A copper-polyimide substrate was prepared in the same manner as in Example 7, except that the entire surface of the polyimide resin film was plated by electroless plating and then electrolytically copper-plated over the surface thereof in a thickness of 5 microns and the resulting substrate film was then heat-treated in the same manner.

The adhesion strength of the copper film to the substrate was 6.9 lb./in. as a mean value according to IPC-TM-650 Method 2.4.9. As Received Method A and was 6.4 lb./in. as a mean value according to IPC-TM-650 Method 2.4.9. After Solder Float Method C.

Next, the substrate was kept in air at 150° C. for 1000 hours and the adhesion strength of the copper film was measured to be 5.0 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 11

A copper-polyimide substrate was prepared in the same manner as in Example 1, except that an electrolytic copper-plated film having a thickness of 35 microns was formed directly after the electroless plating without heat-treatment of the electrolessplated film and thereafter the thus plated substrate was heat-treated in the same manner.

The adhesion strength of the copper film to the substrate : was 9.5 lb./in. as a mean value according to IPC-TM-650 Method 2.4.9. As Received Method A and was 7.8 lb./in. as a mean value according to IPC-TM-650 Method 2.4.9. After Solder Float Method C.

Next, the substrate was kept in air at 150° C. for 1000 hours and the adhesion strength of the copper film was measured to be 3.0 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 12

A copper-polyimide substrate was formed in the same manner as in Exmaple 1, except that the temperature-elevating speed in the heat-treatment in the vacuum heating furnace was 30° C./min. and the heat-treatment was effected at 420° C. for one hour.

The adhesion strength of the copper film to the substrate was 10.4 lb./in. as a mean value in accordance with IPC-TM-650 Method 2.4.9. As Received Method A and was 8.2 lb./in as a mean value according to IPC-TM-650 Method 2.4.9. After Solder Float Method C.

Next, the substrate was kept in air at 150° C. for 1000 hours and the adhesion strength of the copper film was measured to be 3.9 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 13

A copper-polyimide substrate was prepared in the same manner as in Example 1, except that the temperature-elevating speed in the heat treatment in the vacuum heating furnace was 20° C./min and the heat-treatment was effected at 150° C. for 24 hours.

The adhesion strength of the copper film to the substrate was 8.4 lb./in. as a mean value according to IPC-TM-650 Method 2.4.9. As Received Method A and was 7.4 lb./in. as a mean value according to IPC-TM-650 Method 2.4.9. After Solder Float Method C.

Next, the substrate was kept in air at 150° C. for 1000 hours and the adhesion strength of the copper film was measured to be 3.0 lb./in..

Additionally, it was confirmed that the difference in the adhesion strength depending on different portions of the subsrtate was slight and therefore a substantially uniform plated film was formed on the substrate.

These facts demonstrate that the substrate formed has a sufficient reliability in a case of using it in electronic parts such as TAB.

EXAMPLE 14

A copper-polyimide substrate was formed in the same manner as in Example 1, except that the heat-treatment was effected at 250° C. for 12 hours.

The adhesion strength of the copper film to the substrate was 8.5 lb./in. as a mean value according to IPC-TM-650 Method 2.4.9. As Received Method A and was 7.2 lb./in. as a mean value according to IPC-TM-650 Method 2.4.9. After Solder Float Method C.

Next, the substrate was kept in air at 150° C. for 1000 hours and the adhesion strength of the copper film was measured to be 3.2 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 15

A copper-polyimide substrate was formed in the same manner as in Example 1, except that the heat-treatment was effected in a heating furnace having a nitrogen atmosphere of 400° C.

The adhesion strength of the copper film to the substrate was 10.6 lb./in. as a mean value according to IPC-TM-650 Method 2.4.9. As Received Method A and was 7.4 lb./in. as a mean value according to IPC-TM-650 Method 2.4.9. After Solder Float Method C.

Next, the substrate was kept in air at 150° C for 1000 hours and the adhesion strength of the copper film was measured to be 3.5 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 16

A copper-polyimide substrate having a copper film on one surface thereof was formed in the same manner as in Example 6, except that the heat-treatment was effected in an ordinary heating furnace having an aerial atmosphere of 400° C.

The adhesion strength of the copper film to the substrate was 8.7 lb./in. as a mean value according to IPC-TM-650 Method 2.4.9. As Received Method A and was 7.2 lb./in. as a mean value according to IPC-TM-650 Method 2.4.9. After Solder Float Method C.

Next, the substrate was kept in air at 150° C for 1000 hours and the adhesion strength of the copper film was measured to be 3.1 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 17

A copper-polyimide substrate was formed in the same manner as in Example 1, except that the heat-treatment was effected in a heating furnace having a nitrogen atmosphere of 480° C.

The adhesion strength of the copper film to the substrate was 10.1 lb./in. as a mean value according to IPC-TM-650 Method 2.4.9. As Received Method A and was 7.6 lb./in. as a mean value according to IPC-TM-650 Method 2.4.9. After Solder Float Method C.

Next, the substrate was kept in air at 150° C. for 1000 hours and the adhesion strength of the copper film was measured to be 3.9 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 18

Using a copper-polyimide substrate as formed in the same manner as in Example 1, a TAB tape was manufactured in accordance with the process mentioned below.

Precisely, a negative photo-resist was first coated over the copper film of the substrate uniformly in a thickness of 40 microns and dried at 70° C. for 20 minutes. Afterwards, the substrate was masked with a mask in such a way that leads having a lead width of 70 microns and a lead distance of 60 microns in the inner lead parts could be formed on the substrate, and the photoresist layer was then irradiated with ultraviolet rays of 1000 mJ/cm$^2$ through the mask and thereafter developed.

Next, electrolytic copper-plating was applied to the electroless copper-plated film as exposed by the previous development, under the conditions mentioned below.

| Bath Composition | |
|---|---|
| $CuSO_4.5H_2O$ | 80 g/liter |
| $H_2SO_4$ | 180 g/liter |
| Electrolysis Condition | |
| Temperature | 25° C. |
| Cathode Current Density | 3 A/dm$^2$ |
| Stirring | Air and Cathode Locker |
| Time | one hour |

Next, the resist layer was removed, and the electroless copper-plated film thus exposed was removed by treatment with an aqueous solution of 20% by weight of cupric chloride at 25° C. for one minute whereupon the electrolytic copper-plated film acted as a mask.

Afterwards, a rubber photo-resist was uniformly coated on the entire surface of the substrate in a thickness of 5 microns, and a device hole-forming mask was applied to the surface composed of the polyimide resin and the rubber photo-resist in such a way that the copper leads could be positioned in the device hole to be formed. Under the condition, the photo-resist layer was exposed and developed, and thereafter the substrate was dipped in a hydrazine monohydrate solution at 40° C. for 15 minutes so as to dissolve the polyimide resin. Then, the rubber photo-resist was removed.

After the above-mentioned procedure, a TAB tape with copper leads having a lead thickness of 35 microns, a lead width of 70 microns and a lead distance of 70 microns was obtained Where the TAB tape was used as an electronic part, not only the electric and mechanical properties as well as heat-resistance were good but also the long-time thermal stability was sufficiently reliable. Additionally, in preparing the TAB tape, there was no problem on the peeling of the copper layer and the TAB tape was manufactured stably.

EXAMPLE 19

In Example 18, the heat-treatment was not applied to the step of manufacturing the copper-polyimide substrate but applied to the substrate formed with a circuit for the copper-lead portion in the next step by heating the substrate for one hour in a heating furnace of a nitrogen gas atmosphere maintained at 400° C., and then gold plating was applied to the copper layer of the substrate by using a gold plating solution N-44 containing gold potassium cyanide with a concentration of 17 g/liter (manufactured by N.E. Chemcat Co., Ltd.), under the following conditions.

| Plating Condition | |
|---|---|
| Temperature | 70° C. |
| Cathode Current Density | 1 A/dm$^2$ |
| Stirring | Cathode Locker |
| Time | 9 minutes |

Peeling of the plated layer on the substrate of the obtained TAB tape did not occur. Since the TAB tape is excellent in electrical and mechanical properties, as well as in thermal properties, it has sufficient reliability as an electronic material.

Although the explanation has been made for the production method of TAB tapes in Examples 18 and 19, it has been confirmed that similar excellent effect can be obtained also for the application to the manufacture of various other electronic parts such as circuit wiring boards, for example, printed wiring boards, flexible printed circuits, etc.

COMPARATIVE EXAMPLE 1

A copper-polyimide substrate was prepared in the same manner as in Example 1, except that etching of the surface of the polyimide resin was effected by the use of an aqueous solution of 50% by weight of hydrazine monohydrate at room temperature for 2 minutes.

The adhesion strength of the copper film to the substrate was 9.2 lb./in. as a mean value according to IPC-TM-650 Method 2.4.9. As Received Method A and was 7.6 lb./in. as a mean value according to IPC-TM-650 Method 2.4.9. After Solder Float Method C.

However, after the substrate was kept in air at 150° C. for 1000 hours, the adhesion strength of the copper film lowered to 0.8 lb./in..

Accordingly, it is noted that where the substrate is formed into an electronic part such as TAB, the part is to have a problem of lacking in the reliability to the long-time heat history.

COMPARATIVE EXAMPLE 2

A copper-polyimide substrate was prepared in the same manner as in Example 1, except that the heat-treatment after the electroless plating was not carried out.

The adhesion strength of the copper film to the substrate was 5.8 lb./in. as a mean value according to IPC-TM-650 Method 2.4.9. As Received Method A and was 0.9 lb./in as a mean value according to IPC-TM-650 Method 2.4.9. After Solder Float Method C.

Accordingly, it is noted that where the substrate is formed into an electronic part such as TAB, there would be a possibility of peeling of leads from the substrate in bonding of leads and IC chips and the part is lacking in the reliability in the actual use thereof.

COMPARATIVE EXAMPLE 3

A copper-polyimide substrate was prepared in the same manner as in Example 1, except that the heat-treatment after the electroless planting was effected in air at 20° C. for 24 hours.

The adhesion strength of the copper film to the substrate was 5.8 lb./in as a mean value according to IPC-TM-650 Method 2.4.9. As Received Method A, whilst the copper film peeled off from the substrate in the test according to IPC-TM-650 Method 2.4.9. After Solder Float Method C.

Accordingly, it is noted that the substrate could not be used as an electronic part such as TAB.

COMPARATIVE EXAMPLE 4

A copper-polyimide substrate was prepared in the same manner as in Example 1, except that the heat-treatment after the electroless plating was effected in air at 430° C. for 30 minutes.

In the obtained substrate, a part of the polyimide resin carbonized. Accordingly, it is understood that the substrate thus heat-treated at such a high temperature could not be used as an electronic part such as TAB.

B. EXAMPLES AND COMPARATIVE EXAMPLES WHERE ETCHING OF POLYIMIDE RESIN IS EFFECTIED BY TWO-STAGE PROCEDURE COMPRISING FIRST-STEP ETCHING WITH DIAMINE AND SECOND-STEP ETCHING WITH QUATERNARY AMMONIUM HYDROXIDE

EXAMPLE 20

A polyimide resin film sample (Kapton 200H, manufactured by Dupont-Toray Co., Ltd.) having a size of 30 cm×30 cm was etched by dipping it in ethylenediamine at 25° C. for 5 minutes (first-step etching), then washed with water and then again etched by dipping it in an aqueous solution of 20% by weight of tetraethylammonium hydroxide for 5 minutes (second-step etching), whereupon one surface of the sample was shielded. Then, the substrate sample was washed with water and OPC-80 Catalyst M (manufactured by Okuno Chemical Industries, Co., Ltd.) was applied to the sample and treated therewith for 5 minutes at 25° C. The sample was again fully washed with water, and OPC-555 Accelerator (manufactured by Okuno Chemical Industries, Co., Ltd.) was applied thereto to effect acceleration treatment of the sample at 25° C. for 7 minutes. The sample was then fully washed with water. After the pre-treatment, the shiled as applied to one surface of the sample was removed, and the sample was subjected to electroless copper-plating under the conditions mentioned below.

| Bath Composition | |
|---|---|
| $CuSO_4.5H_2O$ | 10 g/liter |
| EDTA.2Na | 30 g/liter |
| 37% HCHO | 5 ml/liter |
| 2,2'-Bipyridyl | 10 mg/liter |
| PEG #1000 | 0.5 g/liter |
| **Plating Condition** | |
| Temperature | 65° C. |
| Stirring | Air |
| Time | 5 minutes |

The thickness of the resulting electroless plated copper film was 0.2 micron.

Then, the substrate was stood still in a vacuum heating furnace in which the temperature was elevated at a rate of 10° C./min. under a vacuum degree of $10^{-4}$ Torr, whereupon the substrate was heat-treated therein at 400° C. for one hour and then cooled to room temperature.

Further, the substrate was elecrolytically copper-plated under the conditions mentioned below.

| Bath Composition | |
|---|---|
| $CuSO_4.5H_2O$ | 80 g/liter |
| $H_2SO_4$ | 150 g/liter |
| **Electrolysis Condition** | |
| Temperature | 25° C. |
| Cathode Current Density | 3 A/dm$^2$ |
| Stirring | Air and Cathode Locker |
| Time | one hour |

The thickness of the formed copper film on the substrate was 35 microns. The adhesion of the film was 8.0 lb/in as a mean value according to IPC-TM-650 Method 2.4.9. As Received Method A and was 7.4 lb./in. as a mean value according to IPC-TM-650 Method 2.4.9. After Solder Float Method C.

Next, the substrate was kept in air at 150° C. for 1000 hours and the adhesion strength of the copper film was measured to be 4.3 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 21

A copper-polyimide substrate was prepared in the same manner as in Example 20, except that a polyimide resin film of Kapton 100H (manufactured by Dupont-Toray Co., Ltd.) was used.

The adhesion strength of the copper film to the substrate was 7.8 lb./in. as a mean value according to IPC-TM-650 Method 2.4.9. As Received Method A and was 7.1 lb./in. as a mean value according to IPC-TM-650 Method 2.4.9. After Solder Float Method C.

Next, the substrate was kept in air at 150° C. for 1000 hours, and the adhesion strength of the copper film was measured to be 4.0 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 22

A copper-polyimide substrate was prepared in the same manner as in Example 20, except that a polyimide resin film of Kapton 500H (manufactured by Dupont-Toray Co., Ltd.) was used.

The adhesion strength of the copper film to the substrate was 8.4 lb./in. as a mean value according to IPC-TM-650 Method 2.4.9. As Received Method A and was 7.6 lb./in. as a mean value according to IPC-TM-650 Method 2.4.9. After Solder Float Method C.

Next, the substrate was kept in air at 150° C. for 1000 hours, and the adhesion strength of the copper film was measured to be 4.5 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 23

A copper-polyimide substrate was prepared in the same manner as in Example 20, except that a polyimide resin film of Kapton 200 V (manufactured by Dupont-Toray Co., Ltd.) was used.

The adhesion strength of the copper film to the substrate was 8.2 lb./in. as a mean value according to IPC-TM-650 Method 2.4.9. As Received Method A and was 7.5 lb./in. as a mean value according to IPC-TM-650 Method 2.4.9. After Solder Float Method C.

Next, the substrate was kept in air at 150° C. for 1000 hours and the adhesion strength of the copper film was measured to be 4.4 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 24

A copper-polyimide substrate was prepared in the same manner as in Example 20, except that a polyimide resin film of Upilex 50ss (manufactured by Ube Industries, Ltd.) was used.

The adhesion strength of the copper film to the substrate was 8.6 lb./in. as a mean value according to IPC-TM-650 Method 2.4.9. As Received Method A and was 7.7 lb./in. as a mean value according to IPC-TM-650 Method 2.4.9. After Solder Float Method C.

Next, the substrate was kept in air at 150° C. for 1000 hours and the adhesion strength of the copper film was measured to be 5.8 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic part such as TAB.

EXAMPLE 25

A copper-polyimide substrate was prepared in the same manner as in Example 20, except that a polyimide resin film of NPI 50 (manufactured by Kanegafuchi Chemical Industry Co., Ltd.) was used.

The adhesion strength of the copper film to the substrate was 8.3 lb./in. as a mean value according to IPC-TM-650 Method 2.4.9. As Received Method A and was 7.6 lb./in. as a mean value according to IPC-TM-650 Method 2.4.9. After Solder Float Method C.

Next, the substrate was kept in air at 150° C. for 1000 hours and the adhesion strength of the copper film was measured to be 4.4 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 26

A copper-polyimide substrate was prepared in the same manner as in Example 20, except that the both surfaces of the polyimide resin film were entirely copper-plated without shielding one surface thereof and thereafter heat-treated in the same manner.

The adhesion strength of the copper film to the substrate was 7.5 lb./in. as a mean value according to IPC-TM-650 Method 2.4.9. As Received Method A and was 6.5 lb./in as a mean value according to IPC-TM-650 Method 2.4.9. After Solder Float Method C.

Next, the substrate was kept in air at 150° C. for 1000 hours and the adhesion strength of the copper film was measured to be 5.9 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 27

A copper-polyimide substrate was prepared in the same manner as in Example 20, except that the surface of the polyimide resin film was first dipped in ethylenediamine monohydrate at 25° C. for 10 minutes (first-step etching), then washed with water, and then dipped in an aqueous solution of 20% by weight of tetramethylammonium hydroxide at 25° C. for 5 minutes (second-step etching).

The adhesion strength of the copper film to the substrate was 7.9 lb./in. as a mean value according to IPC-TM-650 Method 2.4.9. As Received Method A and was 7.0 lb./in. as a mean value according to IPC-TM-650 Method 2.4.9. After Solder Float Method C.

Next, the substrate was kept in air at 150° C. for 1000 hours and the adhesion strength of the copper film was measured to be 4.0 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 28

A copper-polyimide substrate was prepared in the same manner as in Example 20, except that the surface of the polyimide resin film was first dipped in ethylenediamine at 25° C. for 5 minutes (first-step etching), then washed with water and then dipped in an aqueous solution of 10% by weight of tetrabutylammonium hydroxide at 50° C. for 5 minutes (secondstep etching).

The adhesion strength of the copper film to the substrate was 7.2 lb./in. as a mean value according to IPC-TM-650 Method 2.4.9. As Received Method A and was 7.2 lb./in. as a mean value according to IPC-TM-650 Method 2.4.9. After Solder Float Method C.

Next, the substrate was kept in air at 150° C. for 1000 hours and the adhesion strength of the copper film was measured to be 4.0 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 29

A copper-polyimide substrate was prepared in the same manner as in Example 20, except that the surface of the polyimide resin film was dipped in ethylenediamine monohydrate at 25° C. for 10 minutes (first-step etching), then washed with water and then dipped in an aqueous solution of 40% by weight of benzyltrimethylammonium hydroxide at 50° C. for 10 minutes (secondstep etching).

The adhesion strength of the copper film to the substrate was 7.6 lb./in. as a mean value according to IPC-TM-650 Method 2.4.9. As Received Method A and was 7.0 lb./in. as a mean value according to IPC-TM-650 Method 2.4.9. After Solder Float Method C.

Next, the substrate was kept in air at 150° C. for 1000 hours and the adhesion strength of the copper film was measured to be 4.1 lb./in..

Additionally, it was conformed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 30

A copper-polyimide substrate was prepared in the same manner as in Example 20, except that the surface of the polyimide resin film was dipped in ethylenediamine at 25° C. for 5 minutes (first-step etching), then washed with water, and then dipped in a methanol solution of 10% by weight of octadecyltrimethylammonium hydroxide at 40° C. for 10 minutes (second-step etching).

The adhesion strength of the copper film to the substrate was 7.0 lb./in. as a mean value according to IPC-TM-650 Method 2.4.9. As Received Method A and was 6.8 lb./in. as a mean value according to IPC-TM-650 Method 2.4.9. After Solder Float Method C.

Next, the substrate was kept in air at 150° C. for 1000 hours and the adhesion strength of the copper film was measured to be 3.8 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 31

A copper-polyimide substrate was prepared in the same manner as in Example 20, except that the surface of the polyimide resin film was dipped in 1,6-diaminohexane at 50° C. for 10 minutes (first-step etching), then washed with water, and then dipped in an aqueous solution of 20% by weight of tetraethylmonium ammonium hydroxide at 25° C. for 5 minutes (second-step etching).

The adhesion strength of the copper film to the substrate was 7.5 lb./in. as a mean value according to IPC-TM-650 Method 2.4.9. As Received Method A and was 7.0 lb./in. as a mean value according to IPC-TM-650-Method 2.4.9 After Solder Float Method C.

Next, the substrate was kept i air at 150° C. for 1000 hours and the adhesion strength of the copper film was measured to be 4.0 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 32

A copper-polyimide substrate was prepared in the same manner as in Example 26, except that the both surfaces of the polyimide resin film were copper-plated by electroless plating, then electrolytically copper-plated to form a copper-plated film having a thickness of 5 microns on each surface, and then heat-treated in the same manner.

The adhesion strength of the copper film to the substrate was 6.7 lb./in. as a mean value according to IPC-TM-650 Method 2.4.9. As Received Method A and was 6.3 lb./in. as a mean value according to IPC-TM-650 Method 2.4.9. After Solder Float Method C.

Next, the substrate was kept in air at 150° C. for 1000 hours and the adhesion strength of the copper film was measured to be 5.5 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 33

A copper-polyimide substrate was prepared in the same manner as in Example 20, except that an electrolytic copper-plated film having a thickness of 35 microns was formed directly after the electroless plating without heat-treatment of the electroless-plated film and thereafter the thus plated substrate was heat-treated in the same manner.

The adhesion strength of the copper film to the substrate was 7.7 lb./in. as a mean value according to IPC-TM-650 Method 2.4.9. As Received Method A and was 7.1 lb./in. as a mean value according to IPC-TM-650 Method 2.4.9. After Solder Float Method C.

Next, the substrate was kept in air at 150° C. for 1000 hours and the adhesion strength of the copper film was measured to be 4.1 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 34

A copper-polyimide substrate was prepared in the same manner as in Example 20, except that the temperature-elevating speed in the heat-treatment in the vacuum heating furnace was 30° C./min. and the heat-treatment was effected at 420° C. for one hour.

The adhesion strength of the copper film to the substrate was 8.8 lb./in. as a mean value according to IPC-TM-650 Method 2.4.9. As Received Method A and was 8.0 lb./in. as a mean value according to IPC-TM-650 Method 2.4.9. After Solder Float Method C.

Next, the substrate was kept in air at 150° C. for 1000 hours and the adhesion strength of the copper film was measured to be 4.7 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 35

A copper-polyimide substrate was prepared in the same manner as in Example 20, except that the temperature-elevating speed in the heat-treatment in the vacuum heating furnace was 20 ° C./min. and the heat-treatment was effected at 150° C. for 24 hours.

The adhesion strength of the copper film to the substrate 7.5 lb./in. as a mean value according to IPC-TM-650 Method 2.4.9. As Received Method A and was 7.0 lb./in. as a mean value according to IPC-TM-650Method 2.4.9. After Solder Float Method C.

Next, the substrate was kept in air at 150° C. for 1000 hours and the adhesion strength of the copper film was measured to be 3.9 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 36

A copper-polyimide substrate was prepared in the same manner as in Example 20, except that the heat-treatment was effected at 250° C. for 12 hours.

The adhesion strength of the copper film to the substrate was 7.4 lb./in. as a mean value according to IPC-TM-650 Method 2.4.9. As Received Method A and was 6.8 lb./in. as a mean value according to IPC-TM-650 Method 2.4.9. After Solder Float Method C.

Next, the substrate was kept in air at 150° C. for 1000 hours and the adhesion strength of the copper film was measured to be 3.8 lb./in. .

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 37

A copper-polyimide substrate was prepared in the same manner as in Example 20, except that the heat-treatment was effected in a heating furnace having a nitrogen atmosphere of 400° C.

The adhesion strength of the copper film to the substrate was 8.0 lb./in. as a mean value according to IPC-TM-650 Method 2.4.9. As Received Method A and was 7.5 lb./in. as a mean value according to IPC-TM-650 Method 2.4.9. After Solder Float Method C.

Next, the substrate was kept in air at 150° C. for 1000 hours and the adhesion strength of the copper film was measured to be 4.4 lb./in..

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 38

A copper-polyimide substrate having a copper film on one surface thereof was prepared in the same manner as in Example 20, except that the heat-treatment was effected in an ordinary heating furnace having an aerial atmosphere of 400° C.

The adhesion strength of the copper film to the substrate was 7.4 lb./in. as a mean value according to IPC-TM-650 Method 2.4.9. As Received Method A and was 6.7 lb./in. as a mean value according to IPC-TM-650 Method 2.4.9. After Solder Float Method C.

Next, the substrate was kept in air at 150° C. for 1000 hours and the adhesion strength of the copper film was measured to be 4.2 lb./in. .

Additionally, it was confirmed that the difference in the adhesion strength depending on different portions of the substrate was slight and therefore a substantially uniform plated film was formed on the substrate.

These facts demonstrate that the substrate formed has a sufficient reliability in a case of using it in electronic parts such as TAB.

EXAMPLE 39

A copper-polyimide substrate was prepared in the same manner as in Example 20, except that the heat-treatment was effected in a heating furnace having a nitrogen atmosphere of 480° C. for 5 minutes.

The adhesion strength of the copper film to the substrate was 8.4 lb./in. as a mean value according to IPC-TM-650 Method 2.4.9. As Received Method A and was 7.8 lb./in. as a mean value according to IPC-TM-650 Method 2.4.9. After Solder Float Method C.

Next, the substrate was kept in air at 150° C. for 1000 hours and the adhesion strength of the copper film was measured to be 4.7 lb./in. .

Additionally, it was confirmed that the difference in the adhesion strength depending on different portions of the substrate was slight and therefore a substantially uniform plated film was formed on the substrate.

EXAMPLE 40

Using a copper-polyimide substrate as prepared in the same manner as in Example 20, a TAB tape was manufactured in accordance with the process mentioned below.

Precisely, a negative photo-resist was first coated over the copper film of the substrate uniformly in a thickness of 40 microns and dried at 70° C. for 20 minutes. Afterwards, the substrate was masked with a mask in such a way that leads having a lead width of 70 microns and a lead distance of 60 microns in the inner lead parts could be formed on the substrate, and the photo-resist layer was then irradiated with ultraviolet rays of 1000 mJ/cm$^2$ through the mask and thereafter developed. Next, electrolytic copper-plating was applied to the electroless copper-plated film as exposed by the previous development, under the conditions mentioned below.

| Bath Composition | |
|---|---|
| $CuSO_4.5H_2O$ | 80 g/liter |

-continued

| | |
|---|---|
| $H_2SO_4$ | 180 g/liter |
| Electrolysis Condition | |
| Temperature | 25° C. |
| Cathode Current Density | 3 A/cm² |
| Stirring | Air and Cathode Locker |
| Time | one hour |

Next, the resist layer was removed, and the electroless copper-plated film thus exposed was removed by treatment with an aqueous solution of 20% by weight of cupric chloride at 25° C. for one minute whereupon the electrolytic copper-plated film acted as a mask.

Afterwards, a rubber photo-resist was uniformly coated on the entire surface of the substrate in a thickness of 5 microns, and a device hole-forming mask was applied to the surface composed of the polyimide resin and the rubber photo-resist in such a way that the copper leads could be positioned in the device hole to be formed. Under the condition, the photo-resist layer was exposed and developed, and thereafter the substrate was dipped in a hydrazine monohydrate solution at 40° C. for 15 minutes so as to dissolve the polyimide resin. Then, the rubber photo-resist was removed.

After the above-mentioned procedure, a TAB tape with copper leads having a lead thickness of 35 microns, a lead width of 70 microns and a lead distance of 60 microns was obtained.

Where the TAB tape was used as an electronic part, not only the electric and mechanical properties as well as heat-resistance were good but also the long-time thermal stability was sufficiently reliable. Additionally, in preparing the TAB tape, there was no problem on the peeling of the copper layer and the TAB tape was manufactured stably.

EXAMPLE 41

In Example 40, the heat-treatment was not applied to the step of manufacturing the copper-polyimide substrate but applied to the substrate formed with a circuit for the copper-lead portion in the next step by heating the substrate for one hours in a heating furnace of a nitrogen gas atmosphere maintained at 400° C., and then gold plating was applied to the copper layer of the substrate by using a gold plating solution N-44 containing gold potassium cyanide with a concentration of 17 g/liter (manufactured by N.E. Chemcat Co., Ltd.), under the following conditions.

| Plating Condition | |
|---|---|
| Temperature | 70° C. |
| Cathode Current Density | 1 A/dm² |
| Stirring | Cathode Locker |
| Time | 9 minutes |

Peeling of the plated layer on the substrate of the obtained TAB tape did not occur. Since the TAB tape is excellent in electrical and mechanical properties, as well as in thermal properties, it has sufficient reliability as an electronic material.

Although the explanation has been made for the production method of TAB tapes in Examples 40 and 41, it has been confirmed that similar excellent effect can be obtained also for the application to the manufacture of various other electronic parts such as circuit wiring boards, for example, printed wiring boards, flexible printed circuits, etc.

COMPARATIVE EXAMPLE 6

A copper-polyimide substrate was prepared in the same manner as in Example 20, except that etching of the surface of the polyimide resin was effected by the use of an aqueous solution of 50% by weight of hydrazine monohydrate at room temperature for 2 minutes.

The adhesion strength of the copper film to the substrate was 9.2 lb./in. as a mean value according to IPC-TM-650 Method 2.4.9. As Received Method A and was 7.6 lb./in. as a mean value according to IPC-TM-650 Method 2.4.9. After Solder Float Method C.

However, after the substrate was kept in air at 150° C. for 1000 hours, the adhesion strength of the copper film was only 0.5 lb./in..

Accordingly, it is noted that where the substrates is formed into an electronic part such as TAB, the part is to have a problem of lacking in the reliability to the long-time heat history.

COMPARATIVE EXAMPLE 7

A copper-polyimide substrate was prepared in the same manner as in Example 20, except that the etching of the surface of the polyimide resin was effected by the use of an aqueous solution containing 20% by weight, to the total weight, of ethylene diamine and 16% by weight, to the total weight, of tetraethylammonium hydroxide.

The adhesion strength of the copper film to the substrate was 4.8 lb./in. as a mean value according to IPC-TM-650 Method 2.4.9. As Received Method A and was 2.0 lb./in. as a mean value according to IPC-TM-650 Method 2.4.9. After Solder Float Method C.

Next, the substrate was kept in air at 150° C. for 1000 hours and the adhesion strength of the copper film was measured to be only 0.5 lb./in..

Accordingly, it is noted that where the substrate is formed into an electronic part such as TAB, the part is to have a problem of lacking in the reliability to the long-time heat history.

COMPARATIVE EXAMPLE 8

A copper-polyimide substrate was prepared in the same manner as in Example 20, except that the heat-treatment after the electroless plating was not carried out.

The adhesion strength of the copper film to the substrate was 5.5 lb./in. as a mean value according to IPC-TM-650 Method 2.4.9. As Received Method A; whilst the metal layer peeled off from the surface of the substrate in the test according to IPC-TM-650 Method 2.4.9. After Solder Float Method C.

Accordingly, it is noted that the substrate could not be used as an electronic part such as TAB.

COMPARATIVE EXAMPLE 9

A copper-polyimide substrate was prepared in the same manner as in Example 20, except that the heat-treatment after the electroless plating was effected in air at 200° C. for 24 hours.

The adhesion strength of the copper film to the substrate was 5.8 lb./in. as a mean value according to IPC-TM-650 Method 2.4.9. As Received Method A; whilst the copper film peeled off from the surface of the substrate in the test according to to IPC-TM-650 Method 2.4.9. After Solder Float Method C.

Accordingly, it is noted that the substrate could not be used as an electronic part such as TAB.

COMPARATIVE EXAMPLE 10

A copper-polyimide substrate was prepared in the same manner as in Example 20, except that the heat-treatment after the electroless plating was effected in air at 430° C. for 30 minutes.

In the obtained substrate, a part of the polyimide resin , carbonized. Accordingly, it is understood that the substrate thus heat-treated at such a high temperature could not be used as an electronic part such as TAB.

As mentioned above, in accordance with the method of the present invention where a part or all of the surfaces of a polyimide resin substrate are plated by electroless plating followed by electrolytically plating to give an adhesive-free copper-polyimide substrate, etching is effected as a pretreatment prior to the electroless plating, by the use of sulfuric acid or by means of a two-stage procedure where the first-step etching is effected with a diamine and the second-step etching is with aquaternary ammonium hydroxide, then a catalyst is applied to the thus etched substrate, and then the substrate is heat-treated at a particularly defined temperature, whereby the thermally unstable denatured layer as formed on the surface of the polyimide resin by the said etching treatment can be modified to a thermally stable structure in which copper hardly diffuses into the inside of the polyimide resin even after the substrate has been exposed in a high-temperature oxidizing atmosphere for a long period of time. Accordingly, not only the plated metal layer as formed on the substrate may have a high adhesion strength sufficiently withstanding thermal shocks such as soldering or the like but also extreme lowering of the adhesion strength of the metal layer to the substrate may be prevented even when the substrate is kept in a high-temperature oxidizing atmosphere for a long period of time.

Further, in the case of manufacturing an electronic part such as a TAB tape by using the substrate, since products having sufficiently high reliability in electrical, mechanical and thermal points of view can be obtained and since peeling of metal layer does not upon production, the present invention can provide an excellent effect of improving the performance of products and capable of attaining stable operation.

While the invention has been described in detail and with reference to specific embodiments thereof, it will be apparent to one skilled in the art that various changes and modifications can be made therein without departing from the spirit and scope thereof.

What is claimed is:

1. A method of preparing a copper-polyimide substrate comprising applying an electroless copper plating to the surface of a polyimide resin, wherein the surface of a polyimide resin is first etched so as to form a hydrophilic denatured layer on the surface of the said polyimide resin and, after a catalyst is imparted to the substrate, the substrate is copper-plated and thereafter heat-treated at a temperature of at least 120° C. in a vacuum atmosphere to thereby modify the hydrophilic denatured layer to a heat-resistant copper-diffusion preventing layer.

2. The method of preparing a copper-polyimide substrate as claimed in claim 1, in which the electroless copper-plating is followed by an electrolytic copper-plating.

3. The method of preparing a copper-polyimide substrate as claimed in claim 1, in which the etching treatment to be applied to the surface of a polyimide resin for forming a hydrophilic denatured layer thereon is effected with sulfuric acid.

4. The method of preparing a copper-polyimide substrate as claimed in claim 3, in which the etching treatment is effected with sulfuric acid having a concentration of 30% by weight or more.

5. The method of preparing a copper-polyimide substrate as claimed in claim 1, in which the etching treatment to be applied to the surface of a polyimide resin for forming a hydrophilic denatured layer thereon is effected by a two-stage process comprising a first-step etching to be effected with a diamine and a second-step etching to be effected with a uaternary ammonium hydroxide.

6. The method of preparing a copper-polyimide substrate as claimed in claim 5, in which the diamine to be employed in the first-step etching applied to the surface of a polyimide resin is a compound of a general formula $H_2N(CH_2)_nNH_2$ (where n represents an integer of form 2 to 6) or a hydrate thereof.

7. The method of preparing a copper-polyimide substrate as claimed in claim 5, in which the quaternary ammonium hydroxide to be employed in the second-step etching applied to the surface of a polyimide resin is a compound of a general formula:

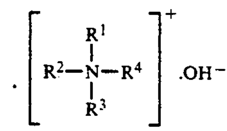

where $R^1$ and $R^2$ independently represent an alkyl group having from 1 to 4 carbon atoms;

$R^3$ represents an alkyl group having from 1 to 18 carbon atoms;

$R^4$ is selected from the group consisting of an alkyl group having from 1 to 18 carbon atoms, an alkenyl group having from 1 to 18 carbon atoms, a benzyl group, and an alkylbenzyl group in which the alkyl moiety has from 1 to 18 carbon atoms.

8. The method of preparing a copper-polyimide substrate as claimed in claim 1, in which the heat-treatment of the substrate is effected within a period of time of initiating decomposition of the chemical structure of the polyimide resin as heat-treated.

9. A method of preparing a printed wiring board having a copper-polyimide substrate, comprising a first step of etching the surface of a polyimide resin substrate, a second step of applying a catalyst to the substrate followed by electroless plating thereof to give a copper-polyimide substrate, and a third step of forming a circuit on the thus prepared copper-polyimide substrate; wherein a hydrophilic denatured layer is formed on the surface of the polyimide resin by the etching step, and including heat treating the substrate at a temperature of at least 120° C. in a vacuum atmosphere before the third step is effected by plating of a conductive metal on the surface of the substrate by the use of at least one of free cyan and a cyan compound, whereby the hydrophilic denatured layer is modified into a heat-resistant copper-diffusion preventing layer.

10. The method of preparing a printed wiring board having a copper-polyimide substrate as claimed in claim 9, in which the electroless copper-plating is followed by an electrolytic copper-plating in the second step.

11. The method of preparing a printed wiring board having a copper-polyimide substrate as claimed in claim 9, in which the etching treatment to be applied to the surface of a polyimide resin for forming a hydrophilic denatured layer thereon is effected with sulfuric acid.

12. The method of preparing a printed wiring board having a copper-polyimide substrate as claimed in claim 11, in which the etching treatment is effected with sulfuric acid having a concentration of 30% by weight or more.

13. The method of preparing a printed wiring board having a copper-polyimide substrate as claimed in claim 9, in which the etching treatment to be applied to the surface of a polyimide resin for forming a hydrophilic denatured layer thereon is effected by a two-stage process comprising a first-step etching to be effected with a diamine and a second-step etching to be effected with a quaternary ammonium hydroxide.

14. The method of preparing a printed wiring board having a copper-polyimide substrate as claimed in claim 13, in which the diamine to be employed in the first-step etching applied to the surface of a polyimide resin is a compound of a general formula $H_2N(CH_2)_nNH_2$ (where n represents an integer of from 2 to 6) or a hydrate thereof.

15. The method of preparing a printed wiring board having a copper-polyimide substrate as claimed in claim 13, in which the quaternary ammonium hydroxide to be employed in the second-step etching applied to the surface of a polyimide resin is a compound of a general formula:

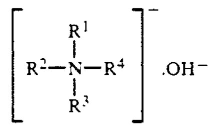

where $R^1$ and $R^2$ independently represent an alkyl group having from 1 to 4 carbon atoms;

$R^3$ represents an alkyl group having from 1 to 18 carbon atoms;

$R^4$ is selected from the group consisting of an alkyl group having from 1 to 18 carbon atoms, an alkenyl group having from 1 to 18 carbon atoms, a benzyl group, and an alkylbenzyl group in which the alkyl moiety has from 1 to 18 carbon atoms.

16. The method of preparing a printed wiring board having a copper-polyimide substrate as claimed in claim 9, in which the heat-treatment of the substrate is effected within a period of time of initiating decomposition of the chemical structure of the polyimide resin as heat-treated.

17. The method of preparing a printed wiring board having a copper-polyimide substrate as claimed in claim 9, in which the printed wiring board is a tape automated bonding (TAB) tape.

18. The method of preparing a printed wiring board having a copper-polyimide substrate as claimed in claim 9, in which the printed wiring board is a flexible printed circuit (FPC).

19. A method of preparing a copper-polyimide substrate comprising applying an electroless copper plating to the surface of a polyimide resin, wherein the surface of a polyimide resin is first etched so as to form a hydrophilic denatured layer on the surface of the said polyimide resin and, after a catalyst is imparted to the substrate, the substrate is copper-plated and thereafter heat-treated at a temperature of at least 250° C. in air or in an inert gas atmosphere to thereby modify the hydrophilic denatured layer to a heat-resistant copper-diffusion preventing layer.

20. A method of preparting a printed wiring board having a copper-polyimide substrate, comprising a first step of etching the surface of a polyimide resin substrate, a second of applying a catalyst to the substrate followed by electroless plating thereof to give a copper-polyimide substrate, and a third step of forming a circuit on the thus prepared copper-polyimide substrate; wherein a hydrophilic denatured layer is formed on the surface of the polyimide resin by the etching step, and including heat treating the substrate at a temperature of at least 250° C. in air or an inert gas atmosphere before the third step is effected by plating of a conductive metal on the surface of the substrate by the use of at least one of free cyan and a cyan compound, whereby the hydrophilic denatured layer is modified into a heat-resistant copper-diffusion preventing layer.

* * * * *